United States Patent [19]

Morich et al.

[11] Patent Number: 5,036,282
[45] Date of Patent: Jul. 30, 1991

[54] BIPLANAR GRADIENT COIL FOR MAGNETIC RESONANCE IMAGING SYSTEMS

[75] Inventors: Michael A. Morich, Richmond Heights; Michael A. Martens, Euclid; Robert W. Brown, Solon, all of Ohio

[73] Assignee: Picker International, Inc., Highland Heights, Ohio

[21] Appl. No.: 368,047

[22] Filed: Jun. 16, 1989

[51] Int. Cl.$^5$ .................................... G01R 33/20
[52] U.S. Cl. .................................... 324/318
[58] Field of Search .............. 324/318, 320, 319; 335/299

[56] References Cited

U.S. PATENT DOCUMENTS

| | | | |
|---|---|---|---|
| 4,297,637 | 10/1981 | Crooks et al. | 324/309 |
| 4,486,711 | 12/1984 | Frese et al. | 324/319 |
| 4,617,516 | 10/1986 | Schneck | 324/318 |
| 4,646,024 | 2/1987 | Schenck et al. | 324/318 |
| 4,737,716 | 4/1988 | Roemer et al. | 324/319 |
| 4,791,370 | 12/1988 | MacKinnon | 324/318 |
| 4,794,338 | 12/1988 | Roemer et al. | 324/318 |
| 4,829,252 | 5/1989 | Kaufman | 324/318 |

FOREIGN PATENT DOCUMENTS 2180943 4/1987 United Kingdom.

OTHER PUBLICATIONS

"Gradient Coil Design for Microscope Imaging of Human Extremities in a One Meter Bore Magnet" by Barlow, et al., SMRM WIP Abstract, Aug. 1988, p. 132.
"A New Method of Gradient Coil Design in MRI" by Fujita, et al., SMRM Book of Abstracts, Aug. 1988, (p. 27).
"An Optimized Highly Homogeneous Shielded Gradient Coil Design" by Carlson, SMRM Book of Abstracts, Aug. 1988, p. 28.
"Coils of Minimum Inductance" by R. Turner, SMRM Book of Abstracts, Aug. 1988, p. 26.
"Self-Shielded Gradient Coil Design Via Eddy Current Modelling" by F. T. D. Goldie, SMRM Book of Abstracts, Aug. 1988, p. 120.
"High Speed, High Field, Planar Surface Gradient Assembly for Fast Imaging" SMRM WIP Abstracts, Aug. 1988, p. 134.
"Active Magnetic Screening of Gradient Coils in NMR Imaging" by Mansfield, et al., J. Mag. Res., 66, pp. 573-576, (1986).
"Active Magnetic Screening of Coils for Static and Time-Dependent Magnetic Field Generation in NMR Imaging" by Mansfield et al., J. Phys. E. Sci. Inst., 19, (1986).
"Minimum Inductance Coils" by R. Turner, J. Phys. E. Sci. Inst. 21, pp. 948-952, (1988).
"Real-Time Movie Imaging from a Single Cardiac Cycle by NMR", by Chapman, et al., Mag. Res. In Med. 5 pp. 246-254, (1987).
"Design Data for Efficient Axial Gradient Coils: Application to NMR Imaging", by St. James, et al., Mag. Res. In Med., 2, pp. 245-252 (1985).

(List continued on next page.)

Primary Examiner—Michael J. Tokar
Attorney, Agent, or Firm—Fay, Sharpe, Beall, Fagan, Minnich & McKee

[57] ABSTRACT

A planar gradient magnetic field assembly (20) selectively causes gradient magnetic fields linearly across the examination region (12) of a magnetic resonance imaging apparatus. The gradient coil assembly includes a pair of planar y gradient coils (22a, 22b) and a pair of planar x gradient coils (24a, 24b). On each plane, the gradient coil winding includes a pair of larger, outer coil loop arrays (60, 62). A pair of smaller inner coil loop arrays (66, 68) produce a first order gradient field correction to improve the accuracy of the gradient field. The coil loop arrays are symmetric relative to the z axis and relative to an (x,y) plane of symmetry perpendicular to the z axis.

19 Claims, 3 Drawing Sheets

OTHER PUBLICATIONS

"Passive Screening of Switched Magnetic Field Gradients" by R. Turner, et al., J. Phys. Scien. Inst., 19, pp. 876–879, (1986).

"A Target Field Approach to Optimal Coil Design" by R. Turner, J. Phy. D. Appl. Phys., 19, pp. L147–151, (1986).

"Coils Producing a Magnetic Field Gradient for Diffusion Measurements with NMR" by Zupancic, et al., J. Phy. E. Sci. Inst., vol. 9, (1976).

"Magnetic Field Gradient Coils for NMR Imaging" by Bangert, et al., J. Phys. E. Sci. Inst., vol. 15, (1982).

"A Finite Element Fourier Expansion Technique for the Design of a Pulsed Radial Gradient System for Magnetic Resonance Imaging (MRI)" by Pillsbury, et al., Trans. of Mag., vol. MAG 21, No. 6, Nov. 1985, pp. 2273–2275.

BIPLANAR GRADIENT COIL FOR MAGNETIC RESONANCE IMAGING SYSTEMS

BACKGROUND OF THE INVENTION

The present invention relates to the art of magnetic field gradient generation. It finds particular application in conjunction with establishing gradient magnetic fields in magnetic resonance imaging techniques and will be described with particular reference thereto. It is to be appreciated, however, that the invention will also find application in spectroscopy and other processes and apparatus in which accurately predictable magnetic field gradients are established or maintained.

In magnetic resonance imaging, a uniform magnetic field is created through an examination region in which a subject to be examined is disposed. A series of radio frequency pulses and magnetic field gradients are applied to the examination region. Gradient fields are conventionally applied as a series of gradient pulses with preselected profiles. These pulses excite magnetic resonance, phase and frequency encode the resonance, and cause phase and frequency encoded magnetic resonance signals to be emitted.

More specifically, the gradient magnetic pulses are applied to select and encode the magnetic resonance signals. In some embodiments, the magnetic field gradients are applied to select one or more planes or slices to be imaged. Gradient field pulses are also applied for selectively modifying the uniform magnetic field to encode frequency and phase into the magnetization, hence the resonance signals in order to identify a spatial location.

The magnetic resonance signals are then processed to generate two or three dimensional image representations of a portion of the subject in the examination region. The accuracy of the resultant image representation, among other factors, is dependent upon the accuracy with which the actually applied magnetic field gradient pulses conform to selected gradient pulse profiles.

Heretofore, linear magnetic filed gradients have been produced by cylindrical gradient field coils. Discrete coils were wound in a bunched or distributed fashion on a large diameter hollow right cylinder tube, commonly 65 centimeters in diameter or larger. Conventional bunched geometries include Maxwell or modified-Maxwell pair for z-gradient production and single or multi-arc Golay saddle coils for x and y gradient production. The coils are normally wound in a series arrangement and positioned to give a magnetic field profile with the desired linearity over a predefined volume. The distributive windings on the right angle cylinders are generally would and in pairs and driven anti-symmetrically. The coils are driven in an anti-symmetric manner such that only odd field derivatives are non-zero at the coil origin. The first derivative is the field gradient while the third and higher order derivatives represents distortion. If the diameter of the cylinder and coil placement are chosen properly, the third derivative is cancelled at the origin making the fifth derivative the first distortion term.

The conventional gradient coils are constructed of copper buss bar or multi-strand wire that is would on a glass reinforced plastic tube. The inductance, which is related to the stored magnetic energy, is critical in gradient coil design. The inductance relates to how quickly the coil can switch the gradient field on and off with a given supply of voltage. Large inductances, as are typical in wound cylindrical coils, limit the switching speed of the gradient magnetic fields.

For maximum efficiency, it would be advantageous to reduce the diameter of the gradient coil cylinders to be as close as possible to the subject, provided gradient linearity can be maintained. The required energy for field gradient production varies roughly as a fifth power of a gradient coil cylinder diameter in free space. In an actual magnetic resonance imager, the gradient coils interact with other adjoining structures such as radiation shields of superconducting magnets, making the relationship somewhat greater than the fifth power. Although reducing the coil size could have a dramatic effect on power consumption, reducing the cylinder diameter below 65 centimeters would be too restrictive to receive patients for full body scans. Although less power consumptive, a single planar surface gradient coil, by contrast, suffers from poor gradient uniformity or field linearity. Images using a single planar gradient coil require geometric distortion correction for head size volumes and larger.

In accordance with the present invention, a new and improved gradient coil configuration is provided which overcomes the above referenced problems and others.

SUMMARY OF THE INVENTION

In accordance with one aspect of the present invention, a gradient coil assembly is provided for generating magnetic field gradients across an examination region. First and second coil loop arrays are disposed on a smooth surface on opposite sides of a line of symmetry. Third and fourth coil loop arrays are disposed along the smooth surface on opposite sides of the line of symmetry and between the first and second coil loop arrays. A power supply supplies current to the coil loop arrays such that the first and third arrays have a net clockwise current flow and the second and third arrays have a net counterclockwise current flow.

In accordance with a more limited aspect of the present invention, four analogous coil loop arrays are disposed along a second smooth surface disposed generally parallel to the first smooth surface such that the gradient field is created therebetween. The first and second smooth surfaces are preferably parallel planes.

In accordance with another aspect of the present invention, a gradient coil assembly is provided on two smooth surfaces. The coil is designed by calculating current flux density and pattern along the two surfaces that produce a selected magnetic field gradient between the surfaces. Coils are configured with a series of conductors disposed along the surface which closely approximate the current density and direction at each point along the surfaces.

In accordance with another aspect of the present invention, a magnetic resonance imaging apparatus is provided which has a gradient coil assembly as described above.

One advantage of the present invention is that it achieves high gradient strengths with relatively short rise times.

Another advantage of the present invention is that it provides improved linearity.

Yet another advantage of the present invention is that it minimizes stored energy, hence, minimizes gradient rise time for a given geometry and desired magnetic field pattern.

Yet another advantage is that it improves patient access.

Still further advantages of the present invention will become apparent to those of ordinary skill in the art upon reading and understanding the following detailed description.

BRIEF DESCRIPTION OF THE DRAWINGS

The invention may take form in various components and arrangements of components. The drawings are only for purposes of illustrating a preferred embodiment and are not to be construed as limiting the invention.

DETAILED DESCRIPTION OF THE PREFERRED EMBODIMENT

Figure 1:
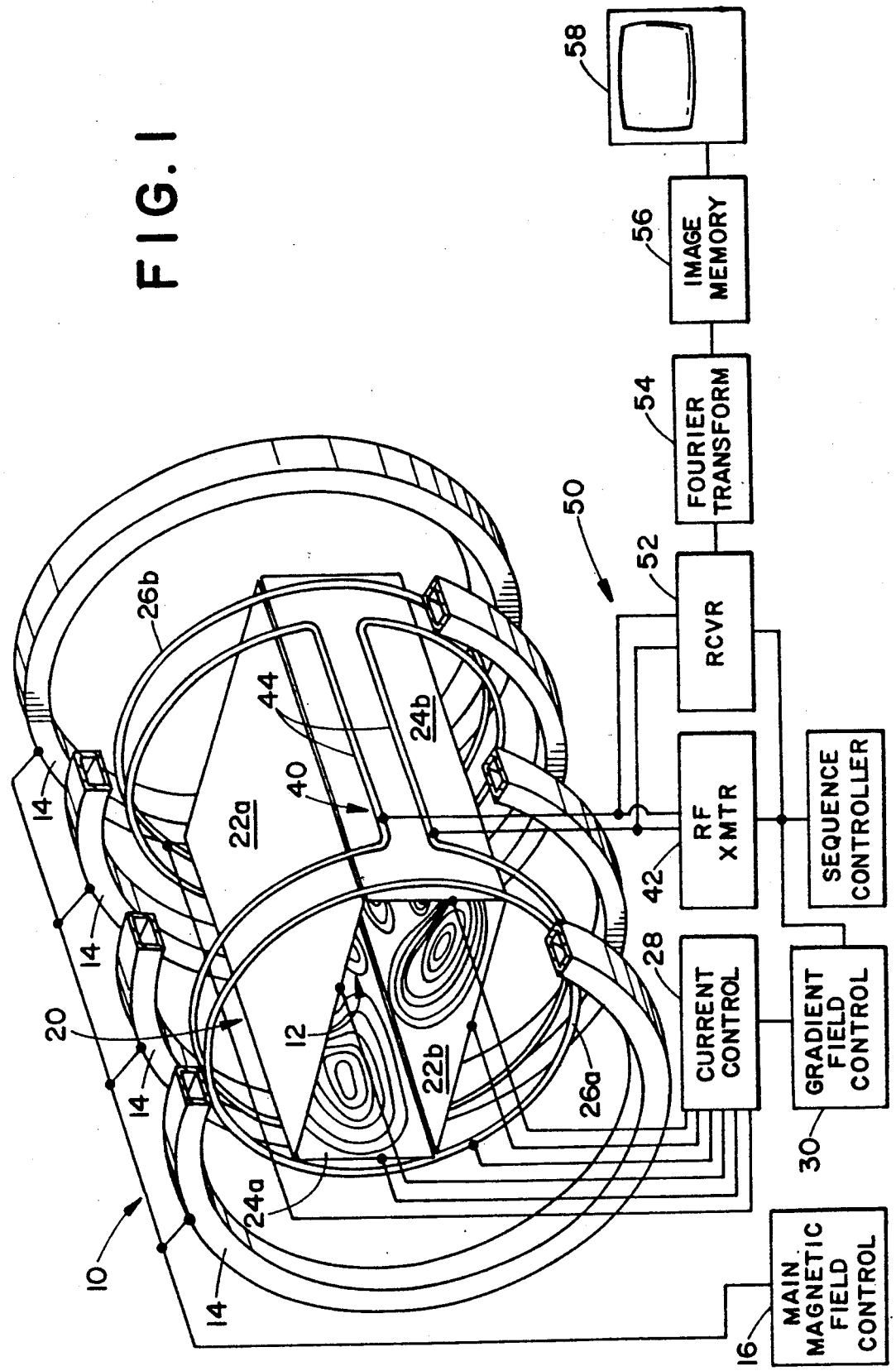
FIG. 1 is a diagrammatic illustration of a magnetic resonance imaging apparatus with a magnetic field gradient coil assembly in accordance with the present invention.

With reference to FIGURE 1, a main magnetic field means 10 generates a substantially uniform magnetic field longitudinally through an examination or image region 12. The main magnetic field means includes a plurality of main field magnets 14 which are operated under control of a magnetic field control means and power supply 16. Preferably, the main magnetic field is a strong uniform field that is aligned with a z or longitudinal axis.

A gradient field means 20 selectively creates gradient magnetic fields across the examination region 12. The gradient field means includes a y gradient coil assembly 22 which applies gradients along a y axis, preferably a vertical axis transverse to the z axis. The y gradient coil assembly includes an upper coil winding assembly 22a and a lower coil winding assembly 22b. Analogously, an x gradient coil assembly 24 selectively applies gradients in the x direction - horizontal, transverse to the z axis in the illustrated embodiment. The x gradient coil assembly is again mounted on two parallel, non-closed surfaces 24a, 24b on opposite sides of the examination region. A z gradient coil assembly 26 includes a pair of annular or other conventional coils 26a, 26b for creating gradients along the z axis.

More specifically to the preferred embodiment, each of the x and y gradient coil assembly includes a plurality of symmetrically arranged windings or coil loops described in greater detail in conjunction with FIG. 2 below. Each of these windings are disposed on one of four smooth surfaces, preferably planes. The surfaces of the y gradient coils 22a, 22b are larger in transverse direction than the surfaces of the x gradient coils 24a, 24b. The difference in width is selected in accordance with the cross sectional aspect ratio of human patients to optimize the shape and size of the examination region.

A current control means 28 selectively supplies electrical currents to each loop of the x, y, and z gradient coils. The current is supplied to the coil loops such that the currents flow through each loop in either a clockwise or counterclockwise direction. More specific to the preferred embodiment, half of the coil arrays on each planar surface have a clockwise current flow and the other half will have a counterclockwise current flow. A gradient field control means 30 controls the current control means 28 to cause it to apply appropriate current pulses to the gradient field windings to cause selected gradient pulses.

A resonance excitation means 40 includes a radio frequency transmitter 42 for generating radio frequency pulses of the appropriate frequency spectrum for inducing resonance in selected dipoles disposed in the examination region. The radio frequency transmitter is connected to a radio frequency antenna 44 disposed adjacent the examination region for transmitting radio frequency pulses into a region of interest of the patient or other subject in the examination region. Although the radio frequency antenna is illustrated as being disposed peripherally around the gradient coil assemblies, it is to be appreciated that such antenna may also be disposed within the gradient coil assemblies. For example, a surface coil may be positioned contiguous to an examined patient or subject for controllably inducing magnetic resonance in a selected contiguous region of the patient.

A magnetic resonance receiving means 50 includes the radio frequency coil 44 which receives, as well as transmits, radio frequency signals in the illustrated embodiment. For other studies, separate transmit and receive coils are used. For example, receive only surface coils may be disposed contiguous to a selected region of the patient to receive resonance induced by the radio frequency coil 44. A radio frequency receiver 52 receives the radio frequency signals from the antenna. The received radio frequency signals are demodulated and reconstructed into an image representation. More specifically, a Fourier transform means 54 transforms magnetic resonance signals into an image representation for storage in an image memory means 56. As is conventional in the art, the image may represent a planar slice through the patient, an array of parallel planar slices, a three dimensional volume, or the like. A display means 58, such as a video monitor, provides a man-readable display of the resultant image. Other conventional processing equipment, which is conventional in the art, is omitted from the illustration for simplicity.

Each of the x and y gradient coil assemblies includes two surfaces that are symmetric with respect to a central plane. The illustrated planar surfaces are parallel to the z axis plane of symmetry. Each surface includes a sheet of non-magnetic and non-conducting material on which a distributed conductive coil assembly is mounted. The distributed coil patterns represent a discrete approximation of an optimal, continuous current distribution. The optimal current is computed to yield minimum stored energy for the desired magnetic field pattern. For the preferred imaging embodiment, the magnetic field pattern is a linear gradient that is symmetric about a geometric center line along the z axis, midway between the x gradient coil surfaces and the y gradient coil surfaces. That is, the field is symmetric about (x,y), (x,y), and (y,z) planes of symmetry. This magnetic field pattern for the biplanar y gradient coil is defined by the equation:

$$\sum_{k=1}^{J} \lambda_k \frac{\mu_o}{2\pi^2} \int_0^\infty \int_0^\infty d\alpha d\beta \frac{\beta^2 e^{-\sqrt{\alpha^2+\beta^2} \cdot a} \operatorname{Sinh}[\sqrt{\alpha^2+\beta^2} \cdot y_k] \operatorname{Sinh}[\sqrt{\alpha^2+\beta^2} \cdot y_j]}{\sqrt{\alpha^2+\beta^2} \cdot \operatorname{Cosh}[\sqrt{\alpha^2+\beta^2} \cdot a]} \quad (1)$$

$$\text{Cos } \alpha x_j \text{ Cos } \alpha x_k \text{ Cos } \beta z_j \text{ Cos } \beta z_k = B_z{}^c (x_j, y_j, z_j), \quad j = 1, 2, \ldots J$$

where $$j_x{}^a (\alpha, \beta) = \frac{-\beta^2}{2\text{Cosh}[\sqrt{\alpha^2 + \beta^2} \cdot a]} \sum_{j=1}^{J} \lambda_j \frac{\text{Cos}\alpha x_j \text{ Cos}\beta z_j \text{ Sinh}[\sqrt{\alpha^2 + \beta^2} \cdot y_j]}{\sqrt{\alpha^2 + \beta^2}} \quad (2)$$

$$j_x{}^a(x,z) = \frac{1}{(2\pi)^2} \int_{-\infty}^{\infty} \int_{-\infty}^{\infty} d\alpha d\beta \, j_x{}^a (\alpha,\beta) e^{i\alpha x + i\beta z} \quad (3)$$

$$j_z{}^a (\alpha, \beta) = \frac{-\alpha}{\beta} j_x{}^a (\alpha, \beta) \quad (4)$$

$$j_z{}^a (x,z) = \frac{1}{(2\pi)^2} \int_{-\infty}^{\infty} \int_{-\infty}^{\infty} d\alpha d\beta \, j_z{}^a (\alpha,\beta) e^{i\alpha x + i\beta z} \quad (5)$$

$$w_m = \frac{\mu_o}{\pi^2} \int_0^{\infty} \int_0^{\infty} d\alpha d\beta \cdot \frac{(j_x{}^a (\alpha, \beta))^2 (1 + \alpha^2/\beta^2) e^{-\sqrt{\alpha^2+\beta^2} \cdot a} \text{Cosh}[\sqrt{\alpha^2 + \beta^2} \cdot a]}{\sqrt{\alpha^2 + \beta^2}} \quad (6)$$

In the equations, "a" represents the half separation distance between the coils, $\lambda_k$ are the solved for Lagrange multipliers, $B_z{}^c (x_j, y_j, Z_j)$ are the desired values of the magnetic flux densities at points $(X_j, Y_j, Z_j)$ $\alpha$ and $\beta$ are Fourier transform variables, $j_x{}^a$ and $j_z{}^a$ are the x and z components of the continuous surface current density function, and $W_m$ is the stored magnetic energy. Analogous equations represent the solution for a biplanar y gradient coil or z gradient coil.

In the preferred magnetic resonance imaging y gradient coil, the values of the magnetic flux density change linearly. Analogous in the y direction and are constant in the x and z direction. For the x gradient coil, the magnetic flux changes linear with distance in the x direction and is constant in the y and z direction. The surface current densities are mirror images on the oppositely disposed coil surfaces such that the gradients vary from positive at one side through zero at the geometric center to a negative value at the opposite end. Alternately, instead of having the zero gradient point in the geometric center of the coils, it may be offset. For example, to facilitate imaging of the spinal region, the magnetic flux may be designed to have the zero gradient displaced from the lower y gradient coil surface a short distance such that it falls within the center of the spine.

Figure 2:
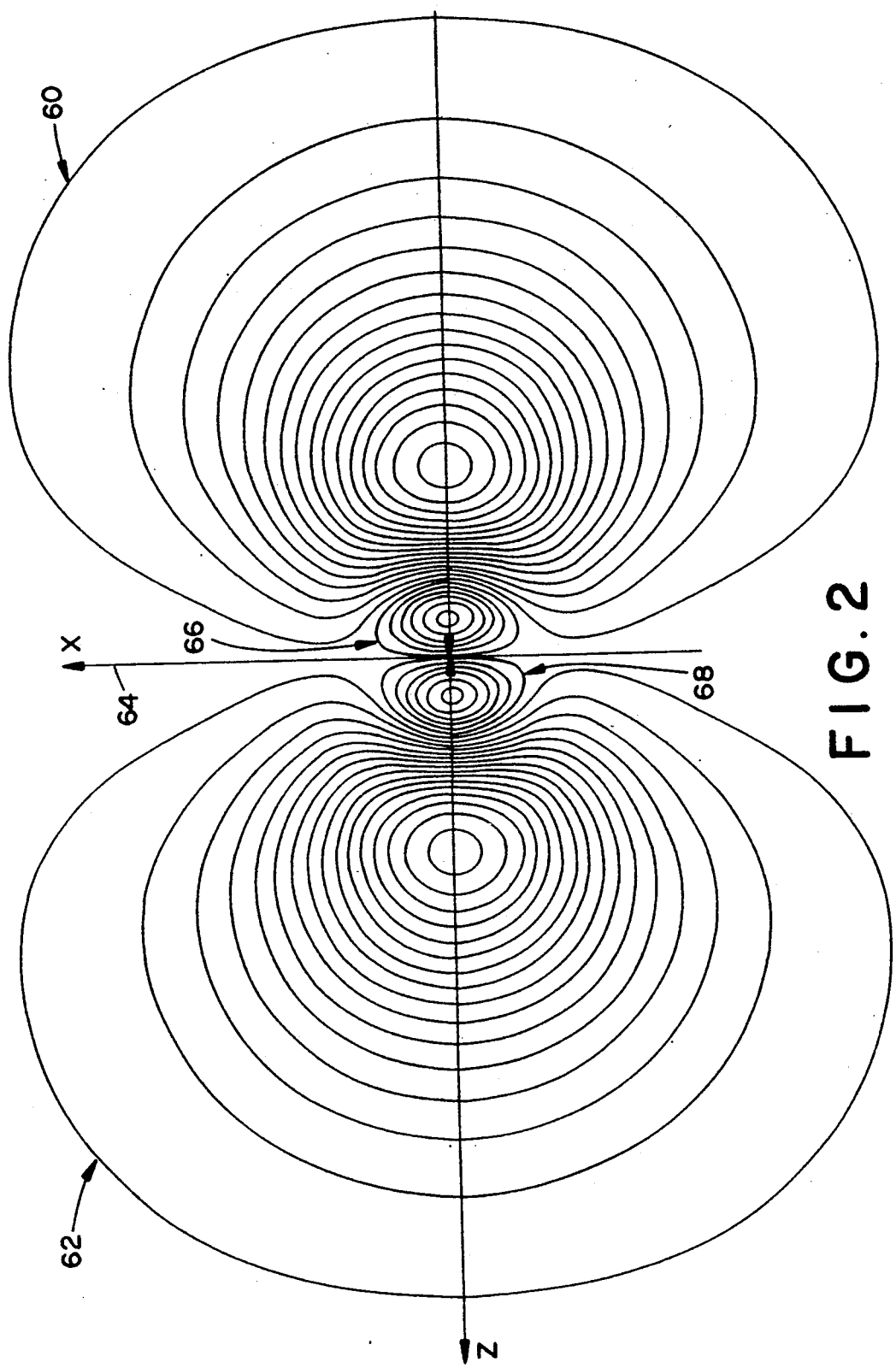
FIG. 2 illustrates a preferred y gradient coil assembly winding pattern in accordance with the preferred embodiment; and, FIG. 3 illustrates a preferred x gradient coil pattern.

With particular reference to FIG. 2, the current density is approximated by a first loop array 60 and a second coil loop array 62 disposed symmetrically about a line of symmetry 64. In the preferred embodiment, the line of symmetry is the intersection between the illustrated plane and a plane of symmetry about which all coil assemblies are symmetric. A first order correction for irregularities in the gradient generated by the first and second loop arrays is made by a third coil loop array 66 and a fourth coil loop array 68. The third and fourth coil loop arrays are also disposed symmetrically about the line of symmetry but are smaller than the first and second coil loop arrays. Each of the four coil loop assemblies include a plurality of generally circular loops which are disposed symmetrically relative to the z axis. Theoretically, the first and second coil loop arrays would include additional peripheral current flow paths carrying progressively smaller amounts of current extending out to infinity. However, physical size constraints put a limit on the maximum size of these coil arrays.

To provide a higher order or more accurate approximation of a linear magnetic field gradient, additional small coil loop arrays may be provided. Such additional coil loop arrays are disposed in pairs symmetric about the z axis between the first and second coil arrays and the line of symmetry. Such additional coil arrays are normally smaller in diameter than the third and fourth coil arrays. The actual number and placement of these additional coil loop arrays is determined by the magnetic field pattern to be achieved and the accuracy with which it is to be approximated.

The opposite y planar surface 22b has, in the embodiment in which the zero gradient is centered, an identical winding pattern. The current control means 28 applies electrical currents to the coils such that the current flow about the first and second coil loop arrays is opposite, e.g. clockwise and counterclockwise, respectively The current control means further applies currents to the third and fourth coil loop arrays such that the current flows in opposite directions relative to each other and relative to the closest of the first and second coil loop arrays, e.g. counterclockwise and clockwise. For example, current may flow clockwise through the first and fourth coil loop array and counterclockwise through the second and third coil loop array on the upper plane 22a. On the lower y coil surface 22b, current flow is the opposite. That is, currents flows counterclockwise through the first and fourth coil loop arrays and clockwise through the second and third current loop arrays.

Figure 3:
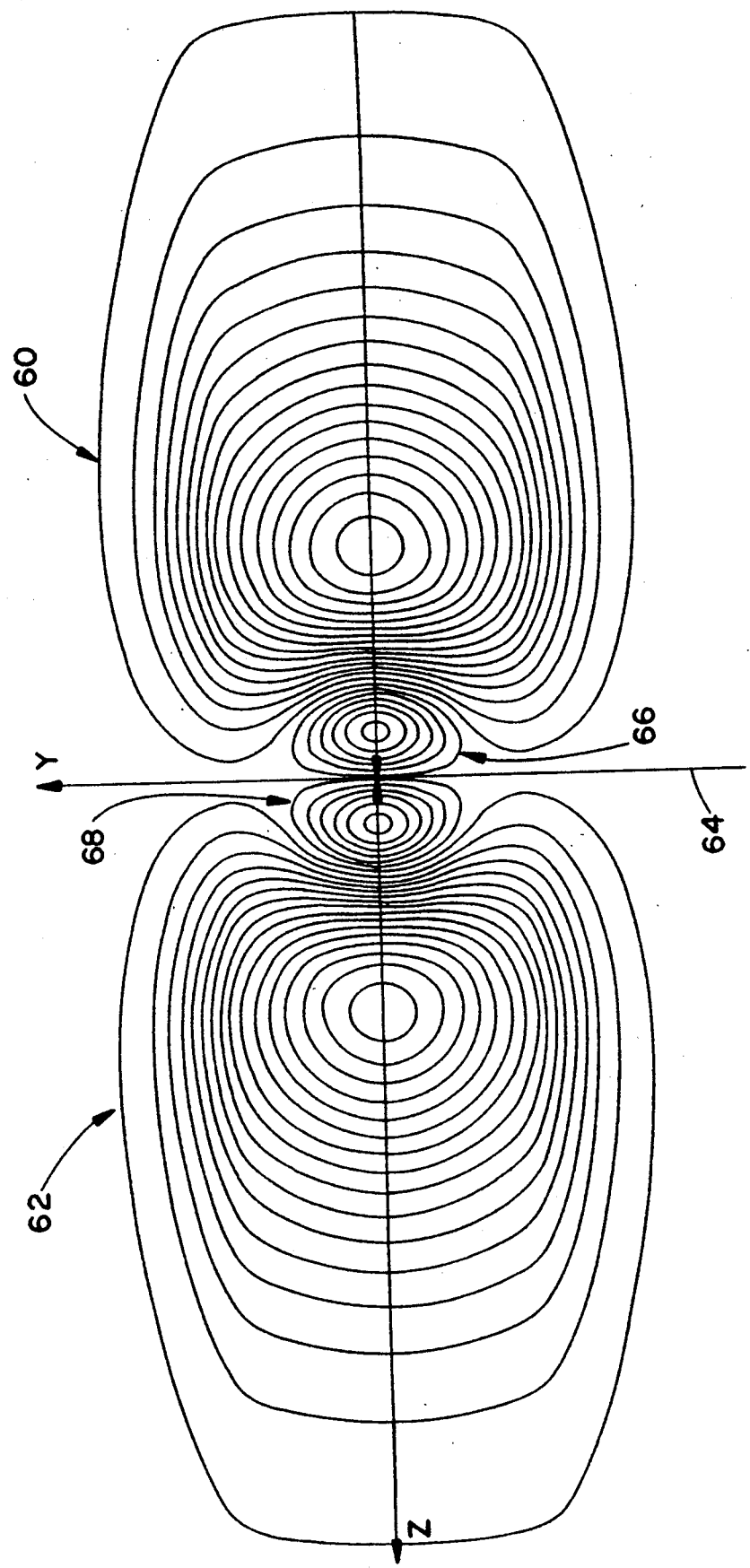

FIG. 3 illustrates a preferred coil winding pattern for the x gradient coil. The coil is substantially the same as the y gradient coil but compressed in width to accommodate the shorter dimension.

Optionally, additional planar coil winding patterns may be provided adjacent the outside of the gradient coils away from the examination region. These additional windings may provide a shielding that cancels the flux density exterior to the biplanar coils. As discussed above, the coils may also be asymmetric in such a manner that the center of the linear field gradient is offset from the geometric center of the examination region. As yet another option, the annular z gradient coils may be replaced with planar coils, where access constraints permit.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance imaging apparatus comprising:
   a main magnetic field means for generating a main magnetic field through an examination region;
   a magnetic field gradient means for generating magnetic field gradients across the examination region, the gradient magnetic field means including:
   first and second coil loop arrays disposed symmetrically to each other about a line of symmetry and along a planar surface,
   third and fourth coil loop arrays disposed symmetrically about the line of symmetry and between the first and second coil loop arrays along the planar surface,
   a current supply means for supplying an electric current to the coil loop arrays such that the first and fourth coil loop arrays have a net clockwise current flow and the second and third coil loop arrays have a net counterclockwise current flow;
   a magnetic resonance excitation means for selectively exciting magnetic resonance of dipoles disposed in the examination region;
   magnetic resonance signal receiving means for receiving magnetic resonance signals from the resonating dipoles; and,
   a reconstruction means for reconstructing an image representation from the magnetic resonance signals.

2. A magnetic resonance imaging apparatus comprising:
   a main magnetic field means for generating a main magnetic field through an examination region;
   a magnetic field gradient means for generating magnetic field gradients across the examination region, the gradient magnetic field means including:
   first and second coil loop arrays disposed symmetrically to each other about a line of symmetry and along a first surface.
   third and fourth coil loop arrays disposed symmetrically about the line of symmetry and between the first and second coil loop arrays long the first surface,
   fifth and sixth coil loop arrays disposed symmetrically to each other about a line of symmetry and along a second surface, the second surface being disposed substantially parallel to the first surface;
   seventh and eighth coil loop arrays disposed symmetrically about the line of symmetry and between the first and second coil loop arrays along the second surface,
   a current supply means for supplying an electric current to the coil loop arrays such that the first and fourth coil loop arrays have a net clockwise current flow, the second and third coil loop arrays have a net counterclockwise current flow, the fifth and eighth coil loop arrays have a net counterclockwise current flow, and the sixth and seventh coil loop arrays have a net clockwise current flow;
   a magnetic resonance excitation means for selectively exciting magnetic resonance of dipoles disposed in the examination region;
   magnetic resonance signal receiving means for receiving magnetic resonance signals from the resonating dipoles; and,
   a reconstruction means for reconstructing an image representation from the magnetic resonance signals.

3. The magnetic resonance imaging apparatus as set forth in claim 2 further including third and fourth surfaces disposed parallel to each other and generally orthogonal to the first and second surfaces, the third and fourth surfaces each having a plurality of coil loop arrays mounted thereon for selectively generating a gradient magnetic field therebetween.

4. The apparatus as set forth in claim 2 wherein the main magnetic field extends longitudinally along a z axis, and the line of symmetry extends parallel to an x axis such that a magnetic field gradient along a y axis is created.

5. The magnetic resonance apparatus as set forth in claim 4 wherein the first, second, third, and fourth coil loop arrays each intersect a plane of symmetry which is parallel to the y and z axes and are each symmetric thereabout.

6. A magnetic resonance apparatus comprising:
   an air-core type magnet including a plurality of generally parallel electromagnetic coil loops encircling and defining an examination region and a z axis which extends generally centrally therethrough such that a current flow through the electromagnet loop generates a main magnetic field along the z axis through the examination region;
   a biplanar gradient coil assembly having coil windings on each of a pair of parallel planes disposed generally parallel to the z-axis inside of the electromagnet coil loops, and on opposite sides of the examination region for generating gradient magnetic fields across the examination region;
   a resonance excitation means for selectively exciting dipoles in the examination region to resonance; and,
   a magnetic resonance receiving means for receiving radio frequency magnetic resonance signals emanating from the examination region.

7. A magnetic resonance apparatus comprising:
   a main magnetic field means for generating a main magnetic field along a z axis through an examination region;
   a first biplanar coil assembly having coil windings on each of a pair of parallel planes disposed on opposite sides of the examination region for generating gradient magnetic fields through the examination region;
   a second biplanar coil assembly having windings disposed along a pair of planes disposed generally orthogonal to the first pair of planes, parallel to the z axis and on opposite sides of the examination region;
   a resonance excitation means for selectively exciting dipoles in the examination region to resonance; and, a magnetic resonance receiving means for receiving radio frequency magnetic resonance signals emanating from the examination region.

8. The apparatus as set forth in claim 7 wherein the biplanar coil assemblies include along each plane:
   first and second coil loop arrays disposed symmetrically to each other about a plane of symmetry that is orthogonal to the z axis;
   third and fourth coil loop arrays disposed symmetrically about the plane of symmetry and between the first and second coil loop arrays;
   a current supply means for supplying an electric current to the coil loop arrays such that the first and fourth coil loop arrays have a net clockwise current flow and the second and third coil loop arrays have a net counterclockwise current flow.

9. A gradient coil assembly for generating magnetic field gradients across a region, the coil assembly comprising:
   a first coil loop array disposed along a smooth surface;
   a second coil loop array disposed along the smooth surface;
   a third coil loop array smaller than the first and second coil loop arrays disposed between the first and second coil loop arrays along the smooth surface;
   a fourth coil loop array smaller than the first and second coil loop array disposed along the smooth surface, the first, second, third, and fourth loop arrays being disposed substantially in linear alignment with each other; and,
   a current supply means for supplying current to the coil loop arrays such that the first and fourth coil loop arrays have a net clockwise current flow and the second and third coil loop arrays have a net counterclockwise current flow.

10. The coil assembly as set forth in claim 9 further including:
    a fifth coil loop array disposed along a second smooth surface;
    a sixth coil loop array disposed along the second smooth surface;
    a seventh coil loop array smaller than the fifth and sixth coil loop array disposed between the fifth and sixth coil loop arrays along the second smooth surface;
    an eighth coil loop array smaller than the fifth and sixth coil loop array disposed along the second smooth surface, the fifth, sixth, seventh, and eighth coil loop arrays being disposed substantially in linear alignment parallel to the first, second, third, and fourth coil loop arrays.

11. The coil assembly as set forth in claim 10 wherein the power supply means supplies current to the fifth, sixth, seventh, and eighth coil loop arrays such that the fifth and eighth coil loop arrays have a net counterclockwise current flow and the sixth and seventh coil loop arrays have a net clockwise current flow.

12. The coil assembly as set forth in claim 10 wherein the first, second, fifth, and sixth coil loop arrays are disposed to one side of a plane of symmetry that extends through the first and second surfaces and the third, fourth, seventh, and eighth coil loop arrays are disposed on an opposite side of the plane of symmetry symmetrically to the first, second, fifth, and sixth coil loop arrays.

13. The coil assembly as set forth in claim 10 wherein the first and second smooth surfaces are planar and parallel.

14. The coil assembly as set forth in claim 13 wherein the first, second, fifth, and sixth coil loop arrays are disposed to one side of a plane of symmetry that extends through the first and second surfaces and substantially perpendicular thereto and the third, fourth, seventh, and eighth coil loop arrays are disposed on an opposite side of the plane of symmetry symmetrically to the first, second, fifth, and sixth coil loop arrays.

15. The coil assembly as set forth in claim 14 further including a first plurality of further coil loop arrays disposed along a third plane and a second plurality of further coil loop arrays disposed along a fourth plane, the third and fourth planes being disposed generally parallel to each other and substantially perpendicular to the first and second surfaces.

16. The coil assembly as set forth in claim 15 wherein the first and second pluralities of further coil loop arrays are disposed on the third and fourth planes symmetrically relative to the plane of symmetry.

17. A magnetic resonance imaging apparatus comprising:
    annular main magnetic field magnets for generating a main magnetic field longitudinally therethrough along a z-axis through an examination region;
    a magnetic field gradient means for generating magnetic field gradients across the examination region, the gradient magnetic field means including:
      first and second coil loop arrays disposed symmetrically to each other about a line of symmetry and along a first surface, each loop of the first and second loop arrays having a normal lying perpendicular to the z-axis,
      third and fourth coil loop arrays disposed symmetrically about the line of symmetry and between the first and second coil loop arrays along the first surface, each loop of the third and fourth loop arrays having a normal lying parallel to the normals to the first and second loop arrays and perpendicular to the z-axis,
      a current supply means for supplying an electric current to the coil loop arrays such that the first and fourth coil loop arrays have a net clockwise current flow and the second and third coil loop arrays have a net counterclockwise current flow;
    a magnetic resonance excitation means for selectively exciting magnetic resonance of dipoles disposed in the examination region;
    a magnetic resonance signal receiving means for receiving magnetic resonance signals from the resonance dipoles; and,
    a reconstruction means for reconstructing an image representation from the magnetic resonance signals.

18. A magnetic resonance imaging apparatus comprising:
    a main magnetic field means for generating a main magnetic field through an examination region;
    a magnetic field gradient means for generating magnetic field gradients across the examination region, the gradient magnetic field means including:
      first and second coil loop arrays disposed symmetrically to each other about a line of symmetry and along a first non-closed surface,
      third and fourth coil loop arrays disposed symmetrically about the line of symmetry and between the first and second coil loop arrays along the first non-closed surface, a current supply means for supplying an electric current to the coil loop arrays such that the first and fourth coil loop arrays have a net clockwise current flow and the second and third coil loop arrays have a net counterclockwise current flow;

a magnetic resonance excitation means for selectively exciting magnetic resonance of dipoles disposed in the examination region;

magnetic resonance signal receiving means for receiving magnetic resonance signals from the resonance dipoles; and, a reconstruction means for reconstructing an image representation from the magnetic resonance signals.

19. A magnetic resonance imaging apparatus comprising:

a main magnetic field means for generating a main magnetic field longitudinally through an examination region along a z-axis;

a magnetic field gradient means for generating magnetic field gradients across the examination region along x and y axes which are transverse to the z-axis, the gradient magnetic field means including:

first and second coil loop arrays disposed symmetrically to each other about a line of symmetry and along a first surface, third and fourth coil loop arrays disposed symmetrically about the line of symmetry and between the first and second coil loop arrays along the first surface, a current supply means for supplying an electric current to the coil loop arrays such that the first and fourth coil loop arrays have a net clockwise current flow and the second and third coil loop arrays have a net counterclockwise current flow;

a magnetic resonance excitation means for selectively exciting magnetic resonance of dipoles disposed in the examination region;

magnetic resonance signal receiving means for receiving magnetic resonance signals from the resonance dipoles; and, a reconstruction means for reconstructing an image representation from the magnetic resonance signals.

* * * * *